(12) United States Patent
Qian et al.

(10) Patent No.: US 7,719,359 B1
(45) Date of Patent: May 18, 2010

(54) LOW NOISE VARIABLE GAIN AMPLIFIER

(75) Inventors: Yang Qian, Fremont, CA (US);
Jean-Marc Mourant, Dunstable, MA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 12/178,537

(22) Filed: Jul. 23, 2008

Related U.S. Application Data (60) Provisional application No. 61/007,514, filed on Jul. 31, 2007.

(51) Int. Cl.
*H03F 3/45* (2006.01)

(52) U.S. Cl. .................................. 330/254; 330/124 R (58) Field of Classification Search ...................... 330/9, 330/254, 295, 124 R, 286, 84
See application file for complete search history.

(56) References Cited

U.S. PATENT DOCUMENTS

| 5,723,888 A | 3/1998 | Yu |
|---|---|---|
| 6,124,740 A * | 9/2000 | Klemmer ..................... 327/109 |
| 6,687,156 B2 | 2/2004 | Kobayashi et al. |
| 7,053,707 B2 * | 5/2006 | Fanous et al. ........... 330/124 R |
| 2005/0026365 A1 | 2/2005 | Ding |

FOREIGN PATENT DOCUMENTS

| EP | 0 739 041 A2 | 1/1990 |
|---|---|---|
| WO | WO 94/15363 | 7/1994 |

* cited by examiner

*Primary Examiner*—Robert Pascal
*Assistant Examiner*—Hieu P Nguyen
(74) *Attorney, Agent, or Firm*—Mintz, Levin, Cohn, Ferris, Glovsky and Popeo, P.C.

(57) ABSTRACT

A variable gain amplifier may include a gain block, a voltage control block, and a unity gain buffer block. The gain block may include a plurality of amplifiers having a fixed gain. The voltage control block is coupled to the output of the gain block. Moreover, the voltage control block controls, based on control voltages applied to the plurality of amplifiers having fixed gain, current output by the plurality of amplifiers. The unity gain buffer amplifier is coupled to receive the current output by the plurality of amplifiers of the voltage control block. The unity gain buffer amplifier provides an output signal of the variable gain amplifier. Related systems, methods, and articles are also described.

11 Claims, 9 Drawing Sheets

LOW NOISE VARIABLE GAIN AMPLIFIER

CROSS REFERENCE TO RELATED APPLICATION

This application claims the benefit under 35 U.S.C. §119 (e) of the following provisional application, all of which is incorporated herein by reference in its entirety: U.S. Ser. No. 61/007,514, entitled "Low Noise Variable Gain Amplifier," filed Jul. 31, 2007.

FIELD

The present disclosure generally relates to amplifiers, and more particularly, to low noise variable gain amplifiers.

BACKGROUND

Low noise variable gain amplifiers provide amplification and have low noise. Low noise is a desirable quality of an amplifier. For example, in medical systems (e.g., a Magnetic Resonance Imaging (MRI) system) or communication systems, low noise amplifiers increase a signal, while introducing low noise. Noise refers to any unwanted aspects of a signal, such as Thermal noise, interference, and the like. Generally, all amplifiers introduce some noise when amplifying a signal. Thus, the challenge to amplifier developers is to implement an amplifier with low noise—introducing into the amplified signal as little unwanted signal as possible. A low noise variable gain amplifier refers to a low noise amplifier that can be varied to provide different amounts of gain. Low noise variable gain amplifiers also face the noted challenges with respect to noise.

SUMMARY

The subject matter disclosed herein provides method, apparatus, and computer-readable medium for a variable gain amplifier. In one aspect there is provided a variable gain amplifier. The variable gain amplifier may include a gain block including a plurality of amplifiers having a fixed gain. The variable gain amplifier may also include a voltage control block coupled to the output of the gain block. The voltage control block may control, based on control voltages applied to the plurality of amplifiers having fixed gain, current output by the plurality of amplifiers. The variable gain amplifier may also include a unity gain buffer amplifier coupled to receive the current output by the plurality of amplifiers of the voltage control block. The unity gain buffer amplifier may provide the output signal of the variable gain amplifier.

Variations may include one or more of the following features. A resistor divider block may be coupled to the gain block. The resistor divider block may divide an input provided to at least one of the plurality of amplifiers. The gain block may include differential pair transistors implemented using Bipolar Junction Transistors (BJT). The differential pair transistors may receive input signals from a coupled resistor divider block. The voltage control block may control, based on control signals applied to each of the plurality of amplifiers, the amount of output allowed to pass to the unity gain buffer. A control voltage for each of the plurality of amplifiers may be used. The control voltages may be provided by a bias network or a digital-to-analog converter. The bias network may include a plurality of transistors configured to provide, based on the value of an input voltage, a plurality of control voltages. The gain block may provide an increase, a decrease, or a unity gain to the magnitude of the signal input to the gain block.

The subject matter described herein may be implemented to realize the advantage of providing a variable gain amplifier having low noise. Moreover, the variable gain amplifier may have a gain that can be controlled smoothly across its range of gain.

It is to be understood that both the foregoing general description and the following detailed description are exemplary and explanatory only and are not restrictive. Further features and/or variations may be provided in addition to those set forth herein. For example, the implementations described herein may be directed to various combinations and subcombinations of the disclosed features and/or combinations and subcombinations of several further features disclosed below in the detailed description.

Like labels are used to refer to same or similar items in the drawings.

DETAILED DESCRIPTION

Figure 1:
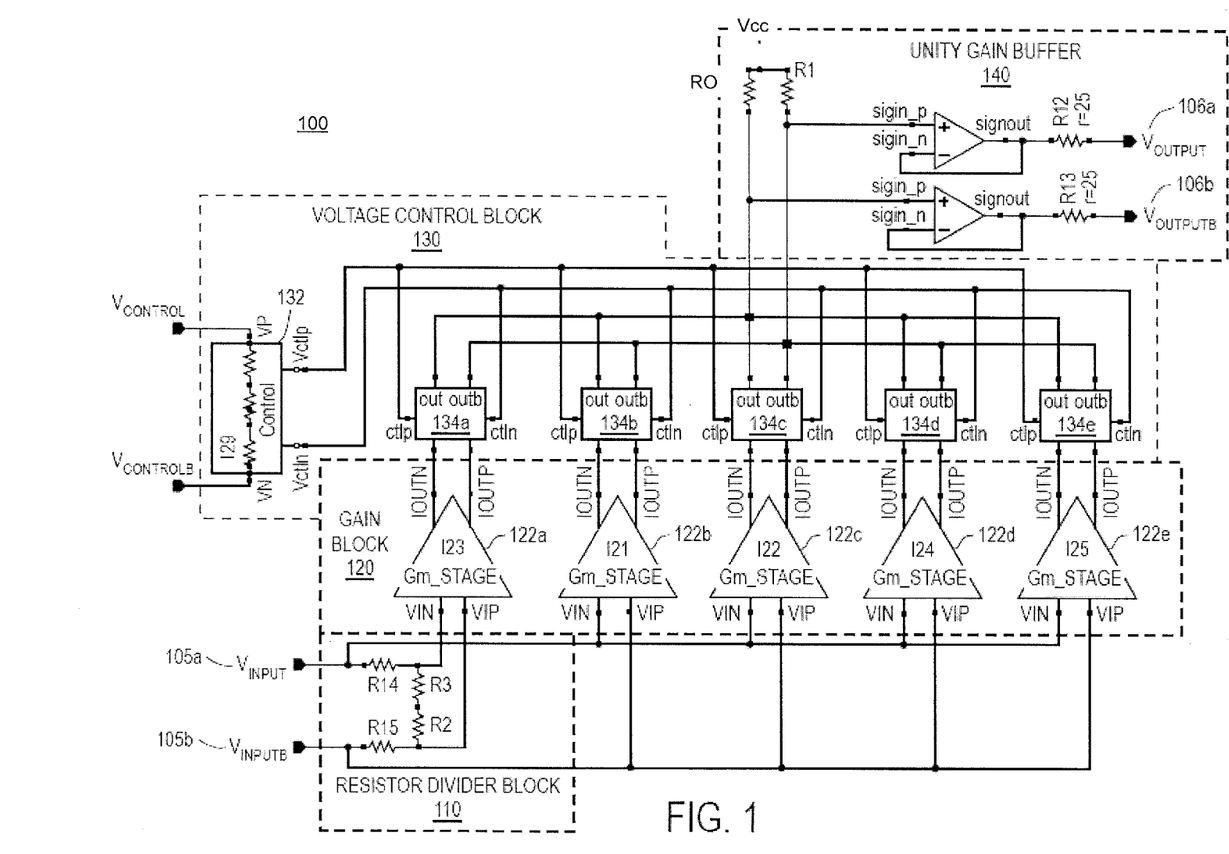
FIG. 1 depicts a circuit diagram of a low noise variable gain amplifier (LNVGA)

FIG. 1 depicts an example of a low noise variable gain amplifier (LNVGA) system 100. The LNVGA system 100 includes a resistor divider block 110, a gain block 120, a voltage control block 130, and a unity gain buffer block 140. The LNVGA system 100 may be implemented to provide an output characterized by low noise when operating at a low gain or a high gain. In some implementations, LNVGA system 100 may be characterized with an output referred noise voltage of 22 nanovolts per $\sqrt{\text{Hertz}}$ at a gain range of −10 dB to +10 dB, although other values may be considered to be low noise as well.

The resistor divider block 110 may include a plurality of resistors (e.g., R2, R3, R14, and R15) for receiving an input signal (e.g., $V_{INPUT}$ 105a and $V_{INPUTB}$ 105b). The resistor divider block 110 divides the received input signal by an amount. Moreover, the divided output of resistor divider block 110 may be provided as an input to gain block 120. For example, resistor divider block 110 may divide an input signal by a value of 2 to reduce by ½ the magnitude of the input signal provided to gain block 120. Although this example describes an input signal divided by 2, the resistor divider block 110 may divide by any other amount as well (e.g., 1, ½, etc.). In some implementations, resistor divider block 110 may be omitted. In the example of FIG. 1, although the input signal $V_{INPUT}$ 105a and $V_{INPUTB}$ 105b represents a differential voltage, other types of input signals may be used as well.

The gain block 120 is coupled to resistor divider block 110 to receive at $V_{IN}$ and $V_{IP}$ the output provided by resistor divider block 110. The gain block 120 provides gain to the input signals $V_{IN}$ and $V_{IP}$. The term "gain" refers to an increase in signal expressed as a ratio of the output to the input. For example, providing a gain of 4 represents that the output is 4 times greater than the input. Continuing with this example, with an input signal of 500 milivolts, a gain of 4 provides an output signal of 2 volts. Although the previous example refers to volts, other units (e.g., current, power, and the like) may be used as well. Moreover, the amount of gain provided by voltage control block 130 may be any value including fractional values (resulting in a decrease rather than an increase in magnitude) and unity values (resulting in little, if any, change in magnitude). Although resistors R0 and R1 are depicted within unity gain buffer block 140, in some implementations, these resistors R0 and R1 may be implemented in other blocks as well. Moreover, the resistors R0 and R1 serve to generate a voltage from the current provided by voltage control block 130 and gain block 120.

In some implementations, gain block 120 may include one or more fixed gain amplifiers 122a-e (labeled Gm Stage). Each one of the fixed gain amplifiers 122a-e may operate at a given gain with a predetermined dynamic range. For example, fixed gain amplifier 122a may operate at a fixed gain of −20 db, fixed gain amplifier 122b may operate at a fixed gain of −8 db, fixed gain amplifier 122c may operate at a fixed gain of +4 db, fixed gain amplifier 122d may operate at a fixed gain of +16 db, and fixed gain amplifier 122e may operate at a fixed gain of +30 db, although other gain values may be used as well.

In some implementations, transconductance amplifiers (also referred to as gm amplifiers) each output a current proportional to an input signal, such as a differential voltage. In some cases, the transconductance amplifier includes an additional input for a current to control the amplifier's transconductance, i.e., the ratio of the output current of the transconductance amplifier to the output voltage of the transconductance amplifier. Fixed gain amplifiers 122a-e may each be implemented as a transconductance amplifier with an output current corresponding to $I_{OUTN}$ and $I_{OUTP}$ and an input voltage corresponding to $V_{IN}$ and $V_{IP}$.

Although FIG. 1 depicts five fixed gain amplifiers 122a-e, any number of fixed gain amplifiers may be used (e.g., six fixed gain amplifiers) as well. When six fixed gain amplifiers are used, the gain of the rightmost amplifier (e.g., fixed gain amplifier 122e) is designed to have the highest amount of gain and, as a consequence, the lowest amount of input dynamic range. While the leftmost fixed gain amplifier is designed to have the lowest gain and, as a consequence, highest input dynamic range.

At the highest gain setting of LNVGA system 100, the output of fixed gain amplifier 122e is steered (i.e., controlled) by voltage control block 130 to provide an output for LNVGA system 100, while at the lowest variable gain setting, the output of fixed gain amplifier 122a is steered by voltage control block 130 to provide an output for LNVGA system 100. The output of LNVGA system 100 is thus controlled by using a so-called "current steering" mechanism described below with respect to voltage control block 130. The ratio of the highest gain to the lowest gain (e.g., G1/G6) determines the total gain control range of LNVGA system 100. The intermediate fixed gain amplifiers 122b-122d as well as fixed gain amplifiers 122a and 122e are steered by voltage control block 130 to provide a so-called "smooth" gain control curve.

In one implementation of fixed gain amplifiers 122a-e, a Bipolar Junction Transistor (BJT) differential pair with degeneration and/or feedback is used, although any fixed gain amplifier that has a current output can be used as well. The transconductance (gm) of a BJT may vary widely (e.g., increasing exponentially with the emitter current).

Voltage control block 130 receives a voltage control signal $V_{CONTROL}$ and $V_{CONTROLB}$. The voltage control signal may be generated by a digital-to-analog controller, a controller, or any other mechanism capable of generating a voltage. The voltage control signal corresponds to a predetermined amount of gain being provided by LNVGA system 100. Moreover, varying the voltage control signal varies the amount of gain provided by LNVGA system 100 as well as the gain provided by each of the plurality of fixed gain amplifiers 122a-e.

Moreover, in some implementations, the voltage control signal $V_{CONTROL}$ and $V_{CONTROLB}$ is provided as an input to a bias network. The bias network (described below with respect to FIG. 6) generates, based on the value of the voltage control signal $V_{CONTROL}$ and $V_{CONTROLB}$, individual control voltages for each of the fixed gain amplifiers 122a-e. The individual control voltages (e.g., voltages V1-V5 at FIG. 2) applied to each of fixed gain amplifiers 122a-e steer (i.e., control) the amount that each of the fixed gain amplifiers 122a-e is allowed to contribute to the overall output of LNVGA 100. For example, the individual control voltages may steer the amount of current allowed to pass from each of the fixed gain amplifiers 122a-e to the output of LNVGA system 100. Moreover, the use of voltage controls block 130 enables smooth control of the overall gain of LNVGA system 100, as the voltage control block 130 controls fixed gain amplifiers 122a-e from a low amount of gain to a high amount of gain. Smooth may refer an output that is linear (or near-linear) in terms of dB.

Voltage control block 130 receives voltage control signals $V_{CONTROL}$ and $V_{CONTROLB}$ from a digital-to-analog controller and/or a controller. The voltage control signals $V_{CONTROL}$ and $V_{CONTROLB}$ may be buffered 132 and provided to a voltage control circuit 134a-e. The voltage control circuits 134a-e receive voltage control signals $V_{CONTROL}$ and $V_{CONTROLB}$ at ctlp and ctln, and generate individual control voltages for each of the fixed gain amplifiers 122a-e to steer the output of each of the fixed gain amplifiers 122a-e. The amount of output current provided by each of the fixed gain amplifiers 122a-e is based on the value of the individual control signals applied to the respective fixed gain amplifier. The individual control signals (e.g., V1-V5 at FIG. 2) applied to each of the fixed gain amplifiers 122a-e steers how much of the output current of the fixed gain amplifiers is allowed to pass to the output of LNVGA system 100. Any output current from fixed gain amplifiers 122a-e are summed since outputs (labeled "out" and "outb") of each of the control circuits 134a-e are placed on a common bus. The outputs are then provided to unity gain buffer 140.

The unity gain buffer 140 (also referred to as a unity gain buffer amplifier) provides unity gain (e.g., a gain of about one) and buffers voltage control block 130 from $V_{OUTPUT}$ 106a and $V_{OUTPUTB}$ 106b. The overall gain of LNVGA system 100 is thus a ratio of the output $V_{OUTPUT}$ 106a and $V_{OUTPUTB}$ 106b to the input $V_{INPUT}$ 105a and $V_{INPUTB}$ 105b.

Figure 2:
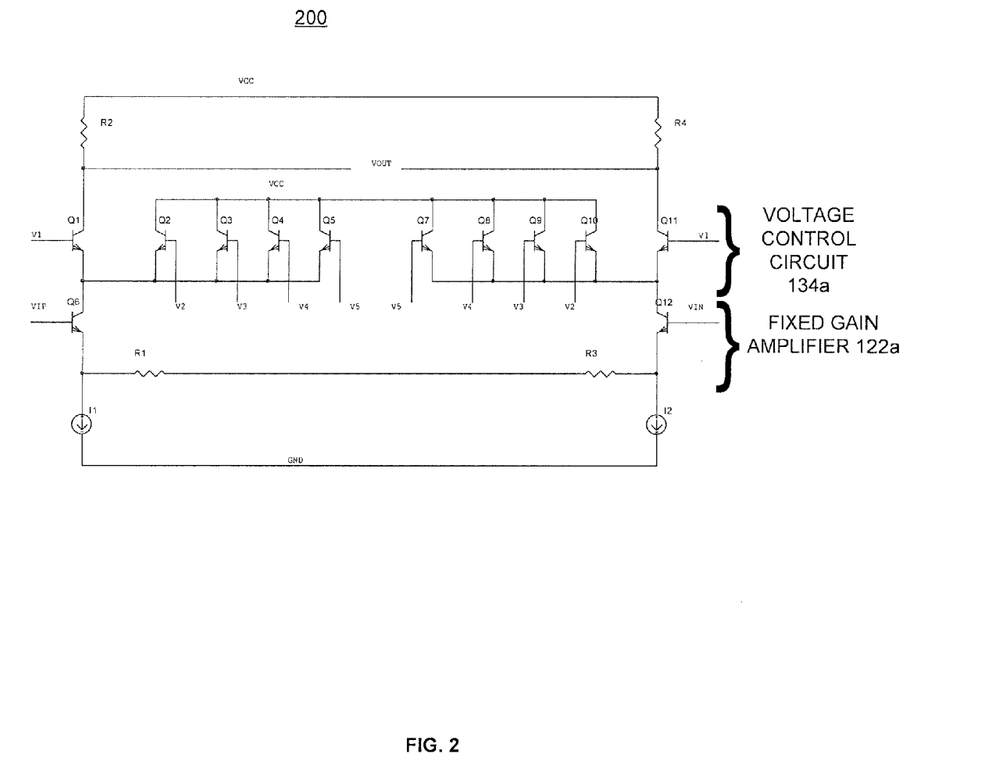
FIG. 2 depicts a portion of the LNVGA circuit diagram of FIG. 1.

FIG. 2 depicts a circuit 200 implementing a portion of FIG. 1. In particular, circuit 200 depicts fixed gain amplifier 122a of gain block 120 and voltage control circuit 134a of voltage control block 130. The voltage control circuit 134a is controlled by individual control voltages V1-V5. The individual control voltages may be generated by the bias network described with respect to FIG. 6. Alternatively, a digital-analog converter may generate individual control voltages V1-V5. The output of circuit 200 is represented by $V_{OUT}$ (corresponding to out and outb at FIG. 1), which is provided to unity gain buffer amplifier 150.

Fixed gain amplifier 122a is implemented as differential pair transistors Q6 and Q12 with input signal $V_{IP}$ and $V_{IN}$. Resistors R1 and R3 are degeneration resistors for controlling the fixed gain of the voltage-to-current stage of the fixed gain amplifier and for increasing the linear operating range of the input. Currents I1 and I2 represent currents injected into fixed gain amplifier 122a. Resistors R2 and R4 of FIG. 2 correspond to resistors R0 and R1 in FIG. 1.

The differential pair transistors Q1-Q5 and Q7-Q11 implement voltage control circuit 134a for steering (i.e., controlling) the amount of current of fixed gain amplifier 122a that is allowed to pass to the output. To steer all of the current to the output of LNVGA system 100, the control voltage V1 is increased to a value above the values of individual control voltages V2-V5. To eliminate the contribution of the output of fixed gain amplifier 122a, the value of V1 is lowered to a value lower than individual control voltages V2-V5. To partially allow an output of fixed gain amplifier 122a to contribute to the overall output of LNVGA system 100, the value of individual control voltage V1 is set to a value by a bias network (described further below with respect to FIG. 6) to an appropriate level by comparing the value of individual control voltage V1 to each of the values of individual control voltages V2-V5. In this partial state, the fixed gain amplifier 122a contributes in proportion to the other fixed gain amplifiers 122b-e based on the values V1 and V2-V5 (i.e., it is a function of the relative values of V1-V5), as described further below with respect to Equations 9-13. Since fixed gain amplifiers 122a-e have different fixed gains, the overall gain of LNVGA system 100 will depend on the values of V1-V5, as described below with respect to Equations 14-19.

In one implementation, the output of LNVGA system 100 at any given instant includes the output of no more than any 3 of the fixed gain amplifiers 122a-e. This implementation simplifies control of fixed gain amplifiers 122a-e by voltage control block 130.

Figure 3:
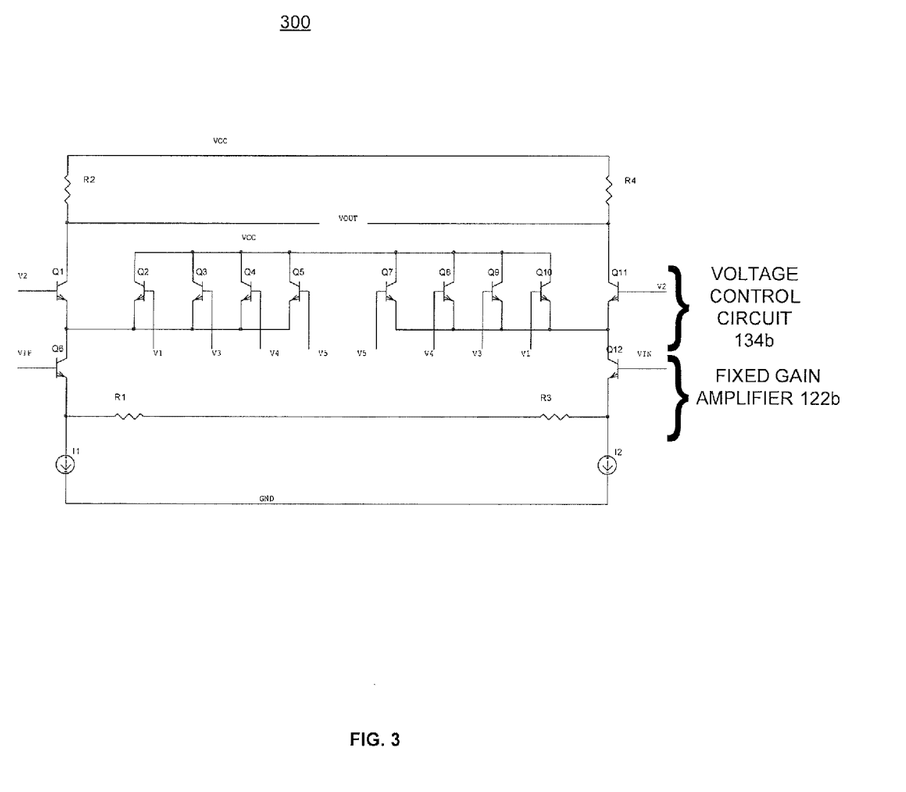
FIG. 3 depicts another portion of the LNVGA circuit diagram of FIG. 1.

FIG. 3 depicts a circuit 300. Circuit 300 is similar to circuit 200, but depicts fixed gain amplifier 122b of gain block 120 and voltage control circuit 134b of voltage control block 130. Fixed gain amplifier 122b is controlled by varying control voltage V2 instead of V1. For example, to steer all of the current of fixed gain amplifier 122b to the output of LNVGA system 100, the control voltage V2 is increased to a value above the values of individual control voltages V1 and V3-V5. To eliminate the contribution of the output of fixed gain amplifier 122b, the value of V2 is lowered to a value lower than individual control voltages V1 and V3-V5. To partially allow an output of fixed gain amplifier 122b to contribute to the overall output of LNVGA system 100, the value of individual control voltage V2 is set at a value by a bias network to an appropriate level by comparing the value of individual control voltage V2 to each of the values of individual control voltages V1 and V-V5. Similarly, other fixed gain amplifiers in gain block 130 may be selected by varying a corresponding control voltage (e.g., V3, V4, V5, and so forth). Resistors R2 and R4 of FIG. 3 correspond to resistors R0 and R1 in FIG. 1.

Figure 4:
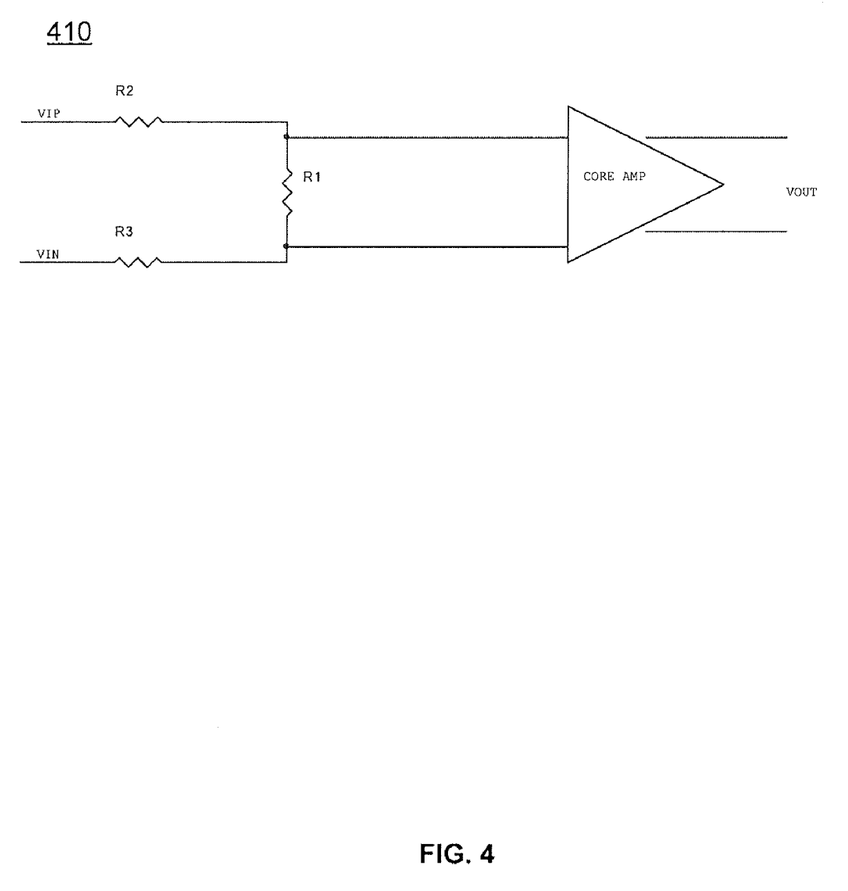
FIG. 4 depicts circuit diagram of a resistor divider.

The range of gain provided by LNVGA system 100 may be extended using resistor divider block 110. FIG. 4 depicts an additional example of resistor divider 410, which may be coupled to fixed gain amplifiers 122a-e to extend the gain range of LNVGA system 100. Moreover, one or more low gain amplifiers may be used as fixed gain amplifiers 122d and e to also extend the gain range controlled by LNVGA system 100.

Figure 5:
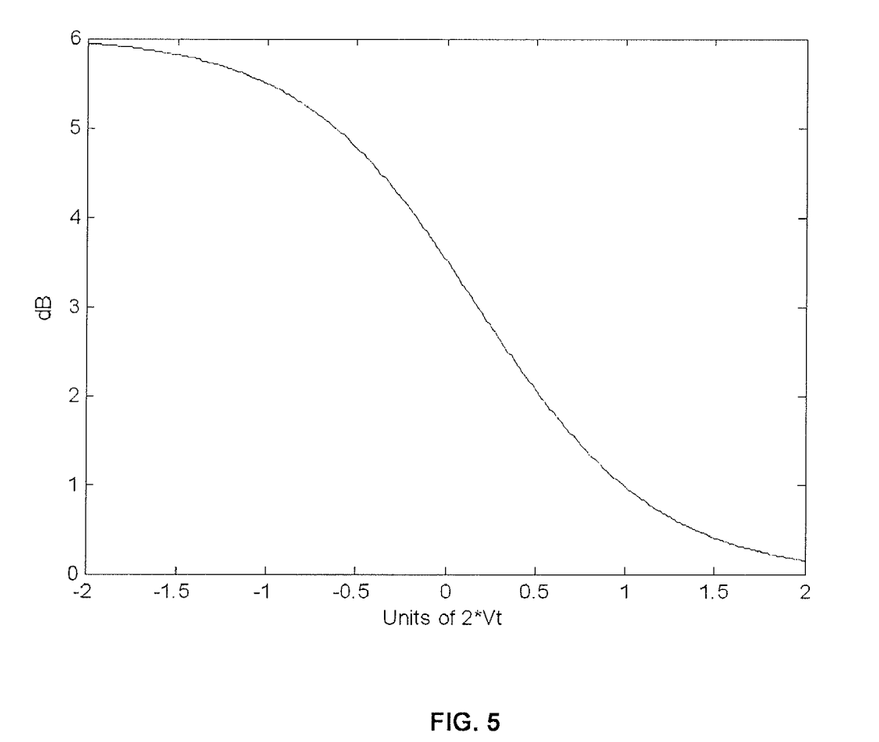
FIG. 5 depicts a plot of the gain provided by two of the fixed gain amplifiers of the LNVGA.

FIG. 5 depicts a plot of the amount of gain provided in decibels (dB) as a function of the difference in V1 and V2 (in units normalized to 2 times the Thermal noise, Vt). The plot of FIG. 5 depicts the effects of only two control voltages and corresponding fixed gain amplifiers 122a-b (having a gain ratio of a). For example, a given control voltage (e.g., $V_{CONTROL}$ and $V_{CONTROLB}$) may be applied to a bias network (see, e.g., FIG. 6) to generate individual control voltages V1 and V2. The difference in the individual control voltages (V1 and V2) corresponds to an overall gain of LNVGA system 100. Referring to the plot at FIG. 5, when V2-V1 equals 0, the corresponding overall gain of LNVGA system 100 is 3 dB. Continuing with the above example of using only fixed gain amplifier 122a (G1) and fixed gain amplifier 122b (G2), the collector current for transistors Q1 and Q11 (FIG. 2) may be determined based on the following:

$$I_{c1} = \frac{I_{c6}}{2} \cdot \left(1 - \tanh\left(\frac{V_1 - V_2}{2 \cdot V_T}\right)\right) \quad \text{Equations 1 and 2}$$

$$I_{c11} = \frac{I_{c12}}{2} \cdot \left(1 + \tanh\left(\frac{V_1 - V_2}{2 \cdot V_T}\right)\right),$$

wherein $I_{c1}$ represents the collector current of transistor Q1 (FIG. 2), $I_{c6}$ represents collector current of transistor Q6, $V_1$ represents the individual control voltage applied to fixed gain amplifier 122a, $V_2$ represents the individual control voltage applied to fixed gain amplifier 122b, $V_T$ represents Thermal voltage (i.e., kT/q, which is about 25.9 millivolts at room temperature), $I_{c11}$ represents collector current for transistors Q11 (FIG. 2), and tan h represents a hyperbolic tangent.

Next, if the difference between $I_{c1}$ and $I_{c11}$ is determined, the following equation results:

$$I_{c1} - I_{c11} = \frac{(I_{c6} - I_{c12})}{2} \cdot \left(1 + \tanh\left(\frac{V_1 - V_2}{2 \cdot V_T}\right)\right) = \quad \text{Equation 3}$$

$$\frac{(I_{G1})}{2} \cdot \left(1 + \tanh\left(\frac{V_1 - V_2}{2 \cdot V_T}\right)\right),$$

wherein $I_{G1}$ represents the difference in currents $I_{c6}$ and $I_{C12}$. Equation 3 may be simplified into the following:

$$I_{o1} = \frac{(I_{G1})}{2} \cdot \left(1 + \tanh\left(\frac{V_1 - V_2}{2 \cdot V_T}\right)\right), \quad \text{Equation 4}$$

$$I_{o2} = \frac{(I_{G2})}{2} \cdot \left(1 - \tanh\left(\frac{V_1 - V_2}{2 \cdot V_T}\right)\right), \quad \text{Equation 5}$$

wherein $I_{o1}$ represents the output current of the first gain stage amplifier 122a (transistors Q1 and Q11 at FIG. 2) and $I_{o2}$ represents the output current of second gain stage amplifier 122b (transistors Q1 and Q11 at FIG. 3).

When the output of the VGA is collected from fixed gain amplifiers 122a and b (i.e., G1 and G2) only, the following equation may be used to determine the output current of LNVGA system 100:

$$I_{VGA} = \frac{(I_{G1})}{2} \cdot \left(1 + \tanh\left(\frac{V_1 - V_2}{2 \cdot V_T}\right)\right) + \frac{(I_{G2})}{2} \cdot \left(1 - \tanh\left(\frac{V_1 - V_2}{2 \cdot V_T}\right)\right), \quad \text{Equation 6}$$

wherein $I_{VGA}$ represents the overall gain of LNVGA system 100 when only two fixed gain amplifiers 122a-b are used. Given that the fixed gain amplifiers of Equation 6 have a gain ratio of alpha (α) and V1/V2 is controlled by external control voltage value x (e.g., $V_{CONTROL}$ and $V_{CONTROLB}$), the following equation represents the output current of LNVGA system 100 as a function of control voltage x:

$$I_{VGA} = A \cdot \left[ \left(1 + \tanh\left(\frac{f(x)}{2 \cdot V_T}\right)\right) + \alpha \cdot \left(1 - \tanh\left(\frac{f(x)}{2 \cdot V_T}\right)\right) \right], \quad \text{Equation 7}$$

wherein A represents ½ $I_{G1}$. The function f(x) may be selected such that $IV_{DA}$ is like a log-linear function. If f(x) is expressed in units of 2*Vt (where * represents multiplication and Vt represents Thermal noise), $I_{VGA}$ of Equation 7 may be represented by the following equation:

$$I_{VGA} = A \cdot [(1 + \tan h(f(x))) + \alpha \cdot (1 - \tan h(f(x)))] \quad \text{Equation 8.}$$

For a value of f(x) equal to a control voltage x and a gain ratio equal to ½ (α=½), the gain control curve is represented at FIG. 5. A digital-to-analog converter may be programmed to provide control voltage $V_{CONTROL}$ and $V_{CONTROLB}$ provided to a bias network, which generates individual control voltages V1 and V2. Alternatively, a digital-to-analog converter may directly provide individual control voltages V1 and V2. Although the above describes using only two fixed gain amplifiers 122a and 122b, when more than two fixed gain amplifiers are used and each gain decreases (or increases) by a fixed amount (dB), the above Equations 1-8 may be modified accordingly to incorporate the additional components. Moreover, the additional fixed gain amplifiers extend the gain control range of LNVGA system 100.

Figure 6:
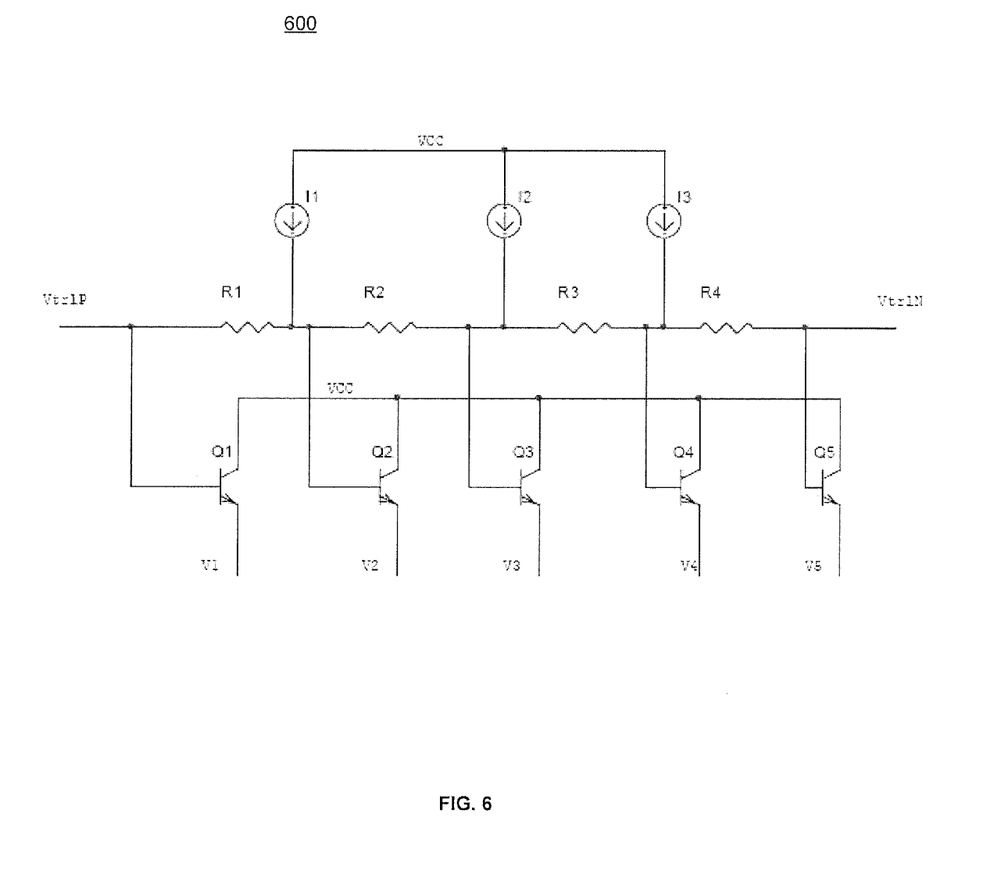
FIG. 6 depicts a bias network for generating control voltages V1-V5.

As noted, the individual control voltages V1-V5 may be generated using a bias network as depicted in FIG. 6, although other techniques may be used to generate control voltages V1-V5 (e.g., a digital-to-analog converter). The individual control voltages V1-V5 are generated based on the value of VtrIP and VtrIN (corresponding to $V_{CONTROL}$ and $V_{CONTROLB}$ at FIG. 1) and the value of direct current sources I1-I3. The individual control voltages V1-V5 may be determined based on the following equations:

$$V_1 = V_{trIP} \quad \text{Equation 9.}$$

$$V_2 = V_{trIP} + \left(\frac{-V_{ctrl}}{4}\right) + \left(1 + \frac{1}{2}\right) \cdot IR. \quad \text{Equation 10}$$

$$V_3 = V_2 + \left(\frac{-V_{ctrl}}{4}\right) + \left(\frac{1}{2}\right) \cdot IR. \quad \text{Equation 11}$$

$$V_4 = V_3 + \left(\frac{-V_{ctrl}}{4}\right) + \left(\frac{-1}{2}\right) \cdot IR. \quad \text{Equation 12}$$

$$V_5 = V_{trIN} \quad \text{Equation 13.}$$

wherein I equals I1 and R equals R1 in Equation 11.

Figure 7A:
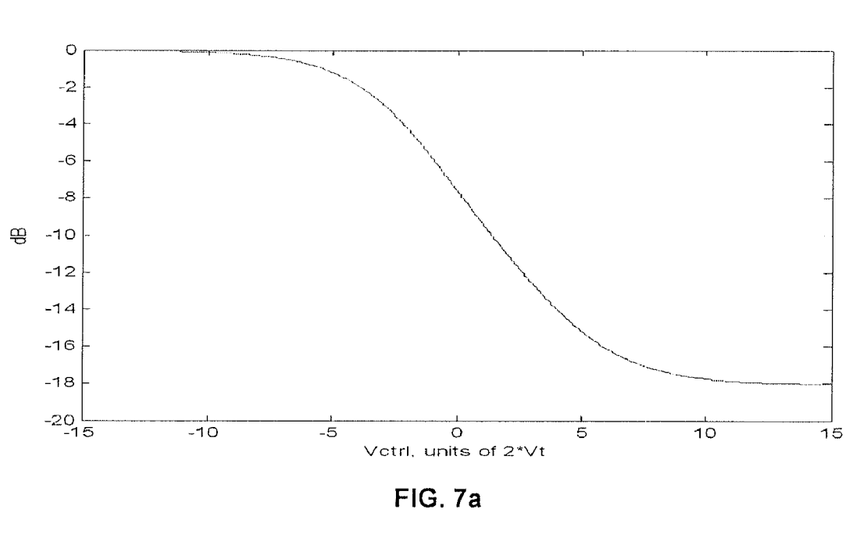
FIG. 7a plots gain versus control voltage.

When the voltages of Equations 9-13 are expressed in units of 2*Vt, the individual control voltages V1-V5 may be generated as depicted in FIG. 7a (given I*R=1 and VtrIP-VtrIN equal to a value of +15 to −15). For example, a gain of −10 dB may be the overall gain of LNVGA system 100 given a value of VtrIP minus VtrIN equal to 0. To provide a gain of −14 dB, the value of VtrIP minus VtrIN would be changed to a value of about 5.

Figure 7B:
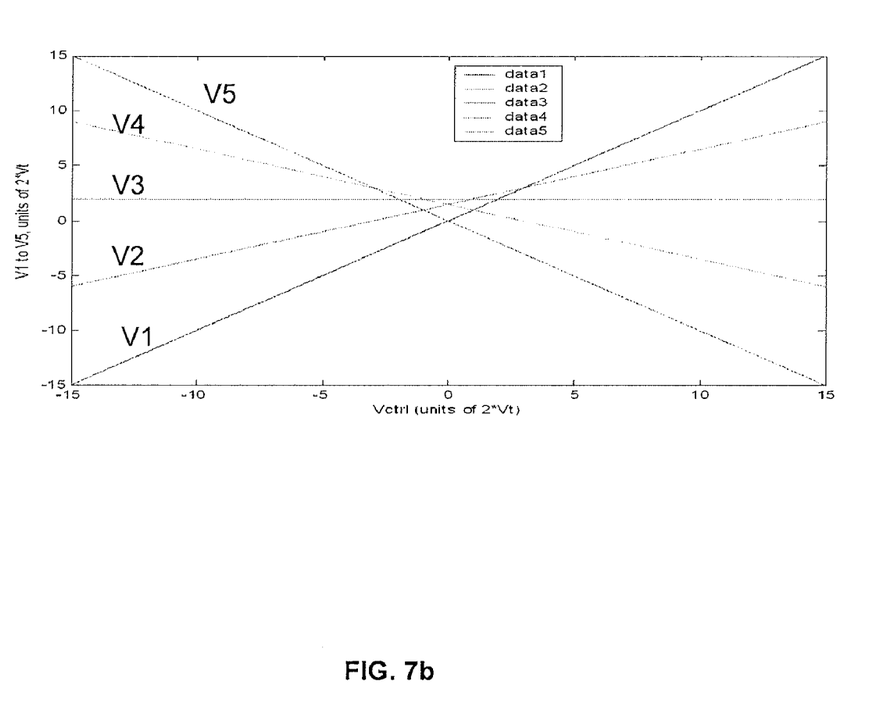
FIG. 7b plots control voltages V1-V5 as a function of control voltage Vctrl.

FIG. 7b plots the individual control voltage values as a function of the control voltage. For example, a control voltage (e.g., VCONTROL-VCONTROLB) of −10 generates a V1 of about −12, a V2 of about −5, a V3 of about 2, a V4 of about 9, and a v5 of about 15, all of which are in normalized units of 2*Vt.

In some implementations, the overall gain of LNVGA system 100 may be approximated based on the following equation:

$$Gain = G_1 + G_2 + G_3 + G_4 + G_5 \quad \text{Equation 14,}$$

wherein G1-G5 correspond to the following set of equations.

$$G_1 = A^*/(1 + e^{v2-v1})$$

$$G_2 = A^* a2/(1 + e^{v2-v1} + e^{v3-v2})$$

$$G_3 = A^* a3/(1 + e^{v2-v31} + e^{v4-v3})$$

$$G_4 = A^* a4/(1 + e^{v5-v4} + e^{v3-v4})$$

$$G_5 = A^* a5^*/(1 + e^{v4-v5}) \quad \text{Equations 15-19,}$$

wherein A represents the gain constant, a2 represents the gain ratio between G2 and G1, a3 represents the gain ratio between G3 and G1, a4 represents the gain ratio between G4 and G1, and a5 represents the gain ratio between G5 and G1. For example, G1-G5 may correspond to the gains at fixed gain amplifiers 122a-e, respectively.

Figure 8:
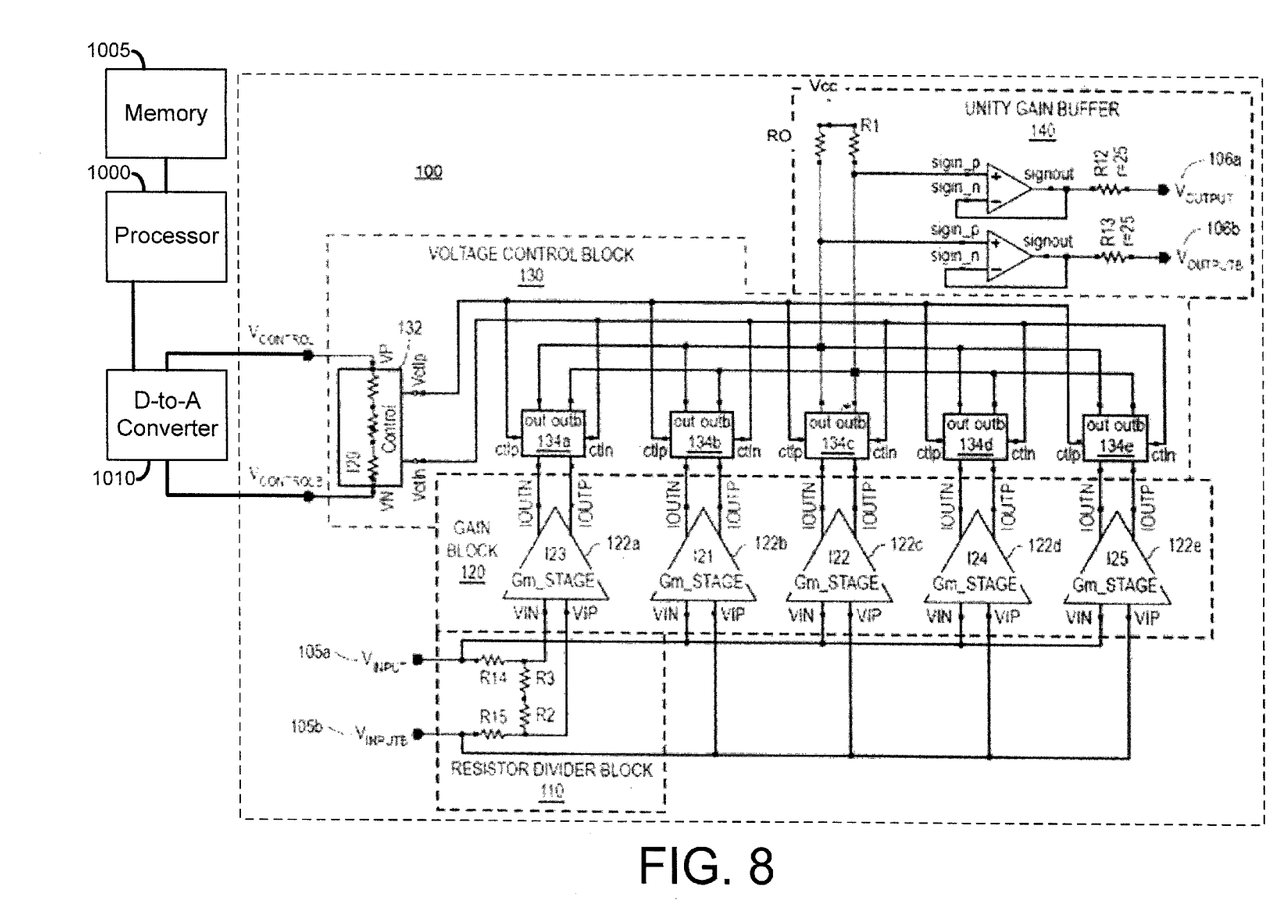
FIG. 8 depicts an exemplary configuration of the LNVGA with other components.

In one implementation, a controller (e.g., a programmable processor) may be used to control a digital-to-analog converter for generating control voltage VCONTROL and VCONTROLB and/or for generating individual control voltages V1-V5 (e.g., processor 1000, memory 1005, and digital-to-analog converter 1010, as shown in FIG. 8). In this implementation, a computer program tangibly embodied in an information carrier (e.g., in a machine-readable storage device or in a propagated signal) for execution by, or to control the operation of, data processing apparatus (e.g., a programmable processor, a computer, or multiple computers) may be implemented. A computer program can be written in any form of programming language, including compiled or interpreted languages, and it can be deployed in any form, including as a stand-alone program or as a module, component, subroutine, or other unit suitable for use in a computing environment.

In view of the foregoing, the subject matter described herein addresses one or more of the following challenges encountered when providing a high performance, low noise VGA: providing a large gain control range; providing high linearity at different gain levels for a constant output level; providing low output noise level; and a linear-by-dB or near linear-by-dB gain control. To address one or more of these challenges, in some implementations, LNVGA system 100 may include multiple fixed gain amplifiers, each one operating at a given gain level with an optimized dynamic range. The LNVGA system 100 may operate over a large gain range by selecting one or more fixed gain amplifiers from among a plurality of fixed gain amplifiers. Some of the plurality of fixed gain amplifiers may provide small gain differentials to enable fine adjustments in gain. In some implementations, the subject matter described may provide a low noise variable gain amplifier including continuous switching of the output from one fixed gain amplifier to another fixed gain amplifier, resulting in smooth gain control. Moreover, the LNVGA system 100 may also be implemented to have high input amplitude, high dynamic range, and low output phase noise.

The systems and methods disclosed herein may be embodied in various forms. Different implementations may feature different combinations of hardware, firmware, and/or software. It may be possible to implement, for example, some or all components described herein in software and/or firmware as well as hardware including, for example, integrated circuits, including ASICs, printed circuit broads, components, and the like. The term "block" as used herein refers to a portion (e.g., one or more components) of LNVGA system 100. The drawings depicting circuit diagrams are exemplary since other circuits may be implemented consistent with the subject matter described and claimed herein.

The foregoing description is intended to illustrate but not to limit the scope of the invention, which is defined by the scope of the appended claims. Other embodiments are within the scope of the following claims.

What is claimed:

1. A variable gain amplifier comprising:
   a gain block including a plurality of amplifiers each having a fixed gain;
   a voltage control block coupled to an output of the gain block and configured to apply control voltages to each of the plurality of amplifiers having a fixed gain, wherein the voltage control block is configured to control, based on the control voltages applied to each of the plurality of amplifiers having fixed gain, a current output by each of the plurality of amplifiers; and
   a unity gain buffer amplifier coupled to receive the current output by the plurality of amplifiers of the gain block, the unity gain buffer amplifier providing an output signal of the variable gain amplifier.

2. The variable gain amplifier of claim 1 further comprising:
   a resistor divider block coupled to the gain block, the resistor divider block dividing an input signal provided to at least one of the plurality of amplifiers, and wherein the unity gain buffer amplifier includes one or more resistors to convert the current to a voltage.

3. The variable gain amplifier of claim 1, wherein the gain block further comprises:
   a plurality of differential pair transistors implemented using Bipolar Junction Transistors (BJT), the plurality of differential pair transistors receiving input signals from a coupled resistor divider block.

4. The variable gain amplifier of claim 1, wherein the voltage control block is further configured to:
   individually control, based on the control voltages applied to each of the plurality of amplifiers, the current output allowed to pass from each of the plurality of amplifiers to the unity gain buffer.

5. The variable gain amplifier of claim 1 further comprising:
   a bias network for generating, based on an input to the bias network, the control voltages.

6. The variable gain amplifier of claim 5, wherein the bias network further comprises:
   a plurality of transistors configured to provide, based on an input to the bias network, control voltages, the control voltages being generated as a function of the input.

7. The variable gain amplifier of claim 4 further comprising:
   a digital-to-analog converter for generating the control voltages.

8. A system comprising:
   a processor; and
   a memory,
   wherein the processor and the memory are configured to generate one or more control voltages provided to a voltage control block, the voltage control block coupled to an output of a gain block including a plurality of amplifiers each having a fixed gain, the voltage control block further coupled to a unity gain buffer amplifier providing the output signal of a variable gain amplifier.

9. The system of claim 8 further comprising:
   generating at least one of the one or more control voltages using one or more of the following equations:

$$V_1 = V_{trlP}, \quad V_2 = V_{trlP} + \left(\frac{-V_{ctrl}}{4}\right) + \left(1 + \frac{1}{2}\right) \cdot IR,$$

$$V_3 = V_2 + \left(\frac{-V_{ctrl}}{4}\right) + \left(\frac{1}{2}\right) \cdot IR,$$

$$V_4 = V_3 + \left(\frac{-V_{ctrl}}{4}\right) + \left(\frac{-1}{2}\right) \cdot IR, \text{ and } V_5 = V_{trlN}.$$

10. A machine readable storage device containing instructions to configure a processor to perform a method, the method comprising:
    generating one or more control voltages provided to a voltage control block, the voltage control block coupled to an output of a gain block including a plurality of amplifiers each having a fixed gain, the voltage control block further coupled to a unity gain buffer amplifier providing the output signal of a variable gain amplifier.

11. The machine readable storage device of claim 10 further comprising:
    generating at least one of the one or more control voltages using one or more of the following equations:

$$V_1 = V_{trlP}, \quad V_2 = V_{trlP} + \left(\frac{-V_{ctrl}}{4}\right) + \left(1 + \frac{1}{2}\right) \cdot IR,$$

$$V_3 = V_2 + \left(\frac{-V_{ctrl}}{4}\right) + \left(\frac{1}{2}\right) \cdot IR,$$

$$V_4 = V_3 + \left(\frac{-V_{ctrl}}{4}\right) + \left(\frac{-1}{2}\right) \cdot IR, \text{ and } V_5 = V_{trlN}.$$

* * * * *